(12) United States Patent
Ramm et al.

(10) Patent No.: US 9,605,338 B2
(45) Date of Patent: Mar. 28, 2017

(54) METHOD FOR DEPOSITING ELECTRICALLY INSULATING LAYERS

(75) Inventors: Jürgen Ramm, Maienfeld (CH); Christian Wohlrab, Feldkirch (AT)

(73) Assignee: OERLIKON SURFACE SOLUTIONS AG, PFAFFIKON, PFAFFIKON SZ (CH)

( * ) Notice: Subject to any disclaimer, the term of this patent is extended or adjusted under 35 U.S.C. 154(b) by 1575 days.

(21) Appl. No.: 11/937,071

(22) Filed: Nov. 8, 2007

(65) Prior Publication Data

US 2008/0286496 A1 Nov. 20, 2008

Related U.S. Application Data

(63) Continuation-in-part of application No. 11/548,529, filed on Oct. 11, 2006, now Pat. No. 7,939,181.

(51) Int. Cl.
| | |
|---|---|
| *C23C 14/08* | (2006.01) |
| *C23C 14/32* | (2006.01) |
| *C23C 14/00* | (2006.01) |
| *H01J 37/32* | (2006.01) |

(52) U.S. Cl.
CPC ........ *C23C 14/325* (2013.01); *C23C 14/0021* (2013.01); *C23C 14/08* (2013.01); *C23C 14/081* (2013.01); *H01J 37/32055* (2013.01); *H01J 37/32064* (2013.01)

(58) Field of Classification Search
CPC ... C23C 14/0021; C23C 14/08; C23C 14/081; C23C 14/325; C23C 14/3485; H01J 37/32055; H01J 37/32064; H01J 37/32082; H01J 37/32137; H01J 37/32165; H01J 37/32431; H01J 37/32623; H01J 37/3405; H01J 37/3408; H01J 37/3467

USPC .............................. 204/192.38, 298.41
See application file for complete search history.

(56) References Cited

U.S. PATENT DOCUMENTS

| | | | |
|---|---|---|---|
| 5,310,607 A | 5/1994 | Schulz et al. | |
| 5,777,438 A * | 7/1998 | Suzuki | 315/111.81 |
| 6,365,009 B1 * | 4/2002 | Ishibashi | 204/192.12 |
| 6,565,957 B2 * | 5/2003 | Nakamura et al. | 428/216 |
| 6,767,627 B2 | 7/2004 | Morikawa et al. | |
| 7,943,017 B2 * | 5/2011 | Ramm et al. | 204/192.38 |
| 2004/0121147 A1 | 6/2004 | Morikawa | |
| 2005/0233551 A1 | 10/2005 | Bergstrom | |

(Continued)

FOREIGN PATENT DOCUMENTS

| | | |
|---|---|---|
| DE | 19522331 A1 | 1/1996 |
| EP | 0513662 A1 | 11/1992 |

(Continued)

OTHER PUBLICATIONS

Machine Translation—EP666335.*
International Search Report (PCT/EP2008/052521) Dated Jul. 11, 2008.

*Primary Examiner* — Michael Band
(74) *Attorney, Agent, or Firm* — Pearne & Gordon LLP

(57) ABSTRACT

The invention relates to a method for operating an arc source, whereby an electric spark discharge is ignited and run on the surface of a target and the spark discharge is simultaneously fed a direct current with an associated constant voltage DV as well as a pulsed current generated by a periodically applied voltage signal. The voltage at the arc source is boosted over several microseconds and the shape of the voltage signal is in essence arbitrarily selectable.

19 Claims, 5 Drawing Sheets

(56) References Cited

U.S. PATENT DOCUMENTS

2006/0066248 A1* 3/2006 Chistyakov .............. 315/111.21
2006/0263640 A1 11/2006 Tamagaki
2007/0000772 A1 1/2007 Ramm

FOREIGN PATENT DOCUMENTS

| EP | 0 666 335 | 8/1995 |
|----|-----------|--------|
| EP | 0 729 173 | 8/1996 |
| EP | 0744473 B1 | 10/2006 |
| JP | 01-042574 | 2/1989 |
| JP | 2002-53946 A | 2/2002 |
| WO | 2004/097062 A1 | 11/2004 |
| WO | 2006/099754 | 9/2006 |
| WO | 2006099758 A2 | 9/2006 |

* cited by examiner

METHOD FOR DEPOSITING ELECTRICALLY INSULATING LAYERS

This application is a continuation-in-part of application Ser. No. 11/548,529 filed Oct. 11, 2006 the entire content of which is incorporated herein by reference.

TECHNOLOGY

This invention relates to a method for operating an arc source as conceptually specified in the claims.

PRIOR ART

Prior art describes various methods for operating arc sources, also referred to as arc evaporation sources or spark evaporators, employing the combination of a DC power supply and a pulsed-current power supply.

EP 0 666 335 B1, for example, proposes a method whereby for the evaporation of highly conductive materials by means of a direct current-operated arc evaporator a pulsed current is superimposed. Pulsed currents of up to 5000 A are generated, at relatively low pulse frequencies within a range from 100 Hz to a maximum of 50 kHz, by capacitor discharges. In the evaporation process of purely metallic targets this is said to also result in a significantly reduced droplet formation. Individual capacitor discharges serve to generate the variously obtainable pulse shapes of the pulsed current. In the process, for instance when a square pulse shape is produced, there will be a very transient increase in the discharge voltage which, however, cannot be held constant but will break down, since due to the low plasma impedance in the spark discharge the spark current promptly increases, resulting in a drop of the capacitor discharge voltage and thus of the spark discharge voltage. In spite of the supposedly positive effect of the transient voltage peaks it is not possible to maintain an elevated spark discharge voltage over an extended period of time.

By contrast, the documents CH 01614/06 (Oct. 10, 2006) and U.S. Ser. No. 11/548,529 (Oct. 11, 2006), filed by the same applicant and hereby made an integral part of this application, disclose methods which, in addition to the method described in EP 0 666 335 B1, employ pulsed spark currents for evaporating metals in a reactive-gas atmosphere for producing insulating and especially oxidic layers. Those applications cover the advantageous effect of pulsing on reduced spattering and address the operation of the spark targets in a reactive gas atmosphere, especially oxygen. They also include the first-ever discussion of the importance of the slope of the current pulse that is superimposed over the spark discharge voltage. This present patent application builds on that earlier invention.

DESCRIPTION OF THE INVENTION

It is the objective of this invention to introduce a method that avoids the above-mentioned shortcomings of prior art while making it possible to combine the advantages of the high ionization rate of a spark discharge with the advantage of an augmented discharge voltage without exposing the spark cathode, in particular the surface of the spark cathode, to a thermal overload. The invention achieves this objective through the characterizing features specified in claim 1.

Accordingly, an electric spark discharge is ignited and maintained on a target surface and is simultaneously operated with a direct current and a relatively low constant voltage from a power supply. At the same time, a pulsed current generated by a periodically applied voltage signal is introduced, with the shape of the voltage signal being in essence arbitrarily selectable.

Basically, there are different ways in which the spark current can be pulsed, thus increasing the spark discharge voltage.

Using a pulsed power source supplying the current for the spark discharge would be the easiest approach. However, it has been found that with conventional, prior-art generators used for switching/pulsing high currents this approach does not, or not adequately, produce a constant increase of the spark discharge voltage, at least not for the duration of the applied signal. The voltage increase is not fast enough and steeper slopes cannot be obtained even at higher frequencies, since it is difficult, if not impossible, to attain these at high spark currents around 100 A or more. Consequently, applying such a pulse signal merely produces a short voltage peak of a modest amplitude which is offset by a current rise, corresponding to the input power, and by the plasma impedance reduction brought about by the rapid increase in the charge-carrier input. Even combining two separate power supplies, one of them pulsed, does not result in a significant improvement.

According to this present invention, the spark current can be operated by the parallel connection of a pulsed voltage source that is capable of delivering a high-powered pulse, thus ensuring the desired shape of the voltage signal. As will be described in more detail further below, this may be achieved for instance by a correspondingly rapid time sequence of several capacitor discharges or by employing a specially designed power supply.

The benefits derived from the invention include, among others, the fact that the improved control or adjustability of the current/voltage range of the spark discharge permits appropriate selection, for different target materials and process conditions, of operating ranges in which layers can be deposited at a high coating rate, known from spark evaporation, that offers a significantly better quality in terms of droplet formation on the surface of the item being coated.

This is not only true for the deposition of metal layers but also, and in particular, for the synthesis of layers in reactive processes at concurrently high deposition rates. For example, the vapor of the target, ionized to an even larger extent than in conventional spark discharge processes, can react with the reactive plasma gas, itself at least partly ionized or dissociated, into a corresponding layer-forming compound on the surface of the object work piece being coated. Apart from the numerous traditional hard materials such as the nitrides, carbides, carbonitrides, borides, silicon compounds as well as other compounds of single or multiple transition metals of the $4^{th}$, $5^{th}$ and $6^{th}$ group of the periodic table of elements (per IUPAC Standard 2005), particular significance is attributed to the possibility, offered by this method, to produce even oxidic or other insulating layers. This pulsed method lends itself especially well to the spark evaporation of carbon. For that material, deflecting the cathodic spark with a pure DC power supply is difficult at best. Superimposing voltage pulses appears to influence the electron emission pattern in a way as to prevent the "stalling" of the root of the spark, permitting the deposition of hydrogen-free, hard carbon layers such as the ta-C. The term "stalling" in this case refers to the extended dwelling of the root of the spark in one, very small area of the target surface, which especially on carbon targets is often accompanied by surface damage, increased spattering and a diminished deposition rate.

Methods suitable for producing mixed crystals of a corundum structure include arc processes without or with a specially configured small, vertical magnetic field, as well as pulse-superimposed arc processes, and also general processes such as arcing or sputtering in which high-current pulses are applied to the material sources such as arc evaporators or sputter sources, or superimposed on the basic DC operation. This permits operation in a contaminated state or an alloying formation on the target, provided certain prerequisites, explained further below, are observed.

In the pulse-source processes for producing in particular thermally stable mixed-crystal layers consisting of multiple oxides in the corundum-type crystal lattice, at least one arc source is simultaneously fed a direct current and a pulsed or alternating current. In that process, a first electrode of an arc or sputter source, in the form of an alloy target, and a second electrode deposit a layer on the work piece, while the source is simultaneously fed a direct current or constant voltage as well as a pulsed or alternating current or a pulsed or AC voltage. The alloy target in this case essentially matches the composition of the mixed-crystal layer. The preferred pulse frequency is in a range between 1 kHz and 200 kHz while the pulsed-current power supply may be operated at a different pulse-width ratio or at interpulse periods.

The second electrode may be separate from the arc source or it may be the anode of the arc source, with both electrodes connected to and operated by a single pulsed-current power supply. If the second electrode is not operated as the anode of the arc source, the arc source can be connected to one of the following material sources and operated via the pulsed-current power supply:

another arc evaporator source which on its part is connected to a DC power supply;
the cathode of a sputter source, especially a magnetron source which again has its own power supply, in particular a DC power supply;
an evaporation crucible which also serves as the anode of a low-voltage arc evaporator.

The DC power is supplied at a base current level in such fashion that the plasma discharge at least at the arc evaporation sources but preferably at all sources is maintained essentially without interruption. Desirably in each case, the DC power supply and the pulsed-current power supply are decoupled by means of an electric decoupling filter which preferably contains at least one cutoff diode. The coating process in this case can take place at temperatures below 650° C. and preferably below 550° C.

As an alternative to spark evaporation, the formation of layers is essentially possible merely by the disaggregation of gaseous precursors, provided the visual connection between the work piece and the spark source is interrupted for instance by shutters or other physical means. Examples hereof include various DLC or diamond layers as described for instance in VDI 2840, Table 1, as well as silicon nitride, boronitride and similar systems. Many of these layers can also be produced by combination processes, where one part of the coating material is deposited from the gaseous phase, the other part from the plasma of a sputter or spark cathode.

The method described also offers the possibility, by appropriate settings of the amplitude and slope of the edge of the periodically applied voltage signal or of the needle or spike pulses forming the voltage signal, to control the electron emission of the spark discharge. The latter intensifies as the amplitude of the voltage signal or the spike pulse is increased or a steeper edge of the voltage increase is selected.

When an electric spark discharge is operated with a direct current and a pulsed current generated by a periodically applied voltage signal, it will be advantageous to set the frequency of the voltage signal between 1 Hz and 200 kHz, preferably between 10 Hz and 50 kHz. The shape of the voltage signal may be for instance a sawtooth, a polygon or a trapezoid, but for many applications preferably a square amplitude because of the particularly rapid inherent voltage rise to the full height of the amplitude and the dwell time at that voltage level PV over the entire pulse length Tp.

The voltage signal, i.e. the voltage generator, may also be operated with pulse gaps, meaning a pulse duration that is shorter than half the length of the period of the operating frequency.

Given the high degree of ionization of the plasma generated by the spark discharge and the correspondingly sufficient number of available charge carriers, the current will rise immediately or with a delay of only a few microseconds. However, since the charge transfer takes place in the plasma by way of electrons as well as ions, which latter display a certain inertia, while on the other hand other resistances such as line impedances in the spark circuit are a factor, the current cannot immediately and to the same extent follow the pulsed voltage signal. In the application of this present method, that effect can be utilized by applying voltage signals of a very high amplitude which, without the time limitation of the pulse duration or of the spike signals, described below in more detail, would quickly lead to a voltage breakdown, an overload of the voltage generator, the development of harmful electric flashovers, a damaged target surface, an interruption of the process or similarly undesirable phenomena. As an alternative or an additional safety precaution, the rise of the current due to the pulse or spike-pulse frequency, i.e. a harmful current increase, may be held in check by turning off the voltage signal when it exceeds a detected current threshold. In either case, as needed for the application concerned, those skilled in the art will be able to optimize the signal pattern for processes involving for instance different target materials or different process-gas compositions by selecting appropriate time constants of the voltage pulse, determining and providing suitably adapted interpulse periods for instance by means of the pulse-gap operation mentioned above.

Advantageously, the signal shape is formed by the sum, i.e. the resultant of a succession of spike pulses generated for instance by a sequentially timed discharge of individual capacitors. The edge steepness of the spike-pulse slope should be at least 0.5 V/µs but preferably at least 2 V/µs, which thus also determines the slope of the voltage signal constituted of the sum of the spikes. The sequence or duration of the spike pulses can be selected between 0.1 kHz and 1 MHz, or 10 ms and 1 µs but preferably between 1 kHz and 500 kHz or 1 ms and 2 µs. As mentioned above, it will be particularly advantageous to select the spike pulses in such fashion that the resultant follows a quasi-stationary voltage gradient over the pulse duration Tp, thus having a nearly square shape, whereby the desired emissions on the cathode can be held stable over the duration of the pulse.

The absolute height of the spike-pulse or voltage-signal amplitude should exceed that of the applied DC voltage by at least 10 percent but preferably by at least 30 percent in order to achieve the desired effects of elevated ionization etc.

The advantage of this succession of capacitor discharges lies in the fact that very high pulse power levels, for instance several hundred kW per pulse, can be attained. By comparison, the DC-operated spark targets run typically at 5 to 10 kW. Yet a high-frequency superimposition with these high-powered pulses from only one capacitor discharge would lead to an overload at the source and/or other parts of the system without guaranteeing the desired voltage stability over the duration of the pulse. It is for that reason that these high-energy capacitor discharges make sense only for frequency ranges of up to about 10 but not more than 50 kHz. However, as those skilled in the art are aware, the discharges of capacitors of lesser capacity and their timed succession are also possible at a higher frequency.

As an alternative, these voltage signals and the corresponding spike pulse trains may be provided by one or several power supplies with arbitrarily selectable signal length, signal frequency, voltage amplitude, interpulse periods and/or signal shape, provided they are designed for delivering pulsed voltage signals with steep slopes. A power supply of that nature is described in detail for instance in WO 06099759. Therefore, that particular patent application and especially the description of the use of such a power supply, referred to as a vacuum plasma generator in that document, from page 14, $2^{nd}$ paragraph, to the bottom of page 17, is hereby declared to constitute an integral part of this present patent application. A generator of that type also makes it possible to obtain an edge steepness of 0.1 V/ns to 1.0 V/ns.

Employing that type of power supplies is desirable especially when higher pulse frequencies between about 10 and 200 kHz are to be used. It must be remembered, however, that using a pulsed voltage source or power supply will always constitute a compromise between the attainable pulse energy and the realizable frequency.

To further enhance the thermal stimulation on the target surface, several experiments have been conducted with uncooled and, respectively, heated targets, evaporating material from the nearly red-hot target surface in an oxygen atmosphere. The layers thus produced again display a corundum-type lattice pattern. In processes of that nature, the rise of the discharge voltage indicates an increase in the plasma impedance that is attributable to the augmented electron emission of glowing surfaces in combination with an increased vapor pressure of the target material and is further intensified by the pulsing of the source current.

Another possible way to produce oxide layers according to this invention is to generate a high-power discharge with at least one source. It can be obtained for instance by operating the pulse-current or pulse-voltage power supplies with a pulse edge steepness at least in the range from 0.02 V/ns to 2.0 V/ns, preferably in the range from 0.1 V/ns to 1.0 V/ns. The currents applied in the process will be at least 20 A but preferably equal to or greater than 60 A, at voltages between 60 and 800 V, preferably between 100 and 400 V above and beyond the voltage and current of the simultaneously triggered DC discharge. These voltage spike pulses can be generated for instance by one or several capacitor cascades which, apart from various other advantages, also permits a relaxation of the base current supply. Preferably, however, the pulse generator is connected between two concurrently DC-operated arc sources. Surprisingly, applying the spike pulses in the arc process will increase the voltage at the source over several μs as a function of the amplitude of the applied voltage signal, whereas pulses with a lesser slope steepness predictably lead only to an increase in the source current.

Initial experiments have shown that with these high-current discharges it is also possible to produce from sputter sources with alloy targets oxidic multioxides in corundum, eskolaite or comparable hexagonal crystal structures, which is presumably due to the increased power density on the target surface and the associated, strong temperature increase. In this case as well, using uncooled or heated targets as described above may prove beneficial. In these processes, the high-power discharge displays similar characteristics for both high-power arcing and high-power sputtering, corresponding to the abnormal glow discharge known from the Townsend-Strom voltage diagram.

Basically there are different ways to achieve an increased impedance of the plasma or of the target surface. As described above, this can be accomplished by superimposing spike pulses, by heating the target surface or by a combination of these procedures. A superimposition in this case is defined as the overlaying of spike pulses over the DC discharge voltage, without necessarily ruling out the possibility of a time-based superposition of the spike pulses in the sense of a sequence of at least partly overlaid spike pulses. It will be self-evident to those skilled in the art that particularly high power levels can be achieved for instance by the simultaneous discharge of two or more capacitors which, for all practical purposes, will deliver an especially high spike pulse.

BRIEF EXPLANATION OF THE DRAWINGS

The following will describe this invention in more detail with the aid of drawings, which merely illustrate a few different implementation examples of this invention and in which.

Figure 1:
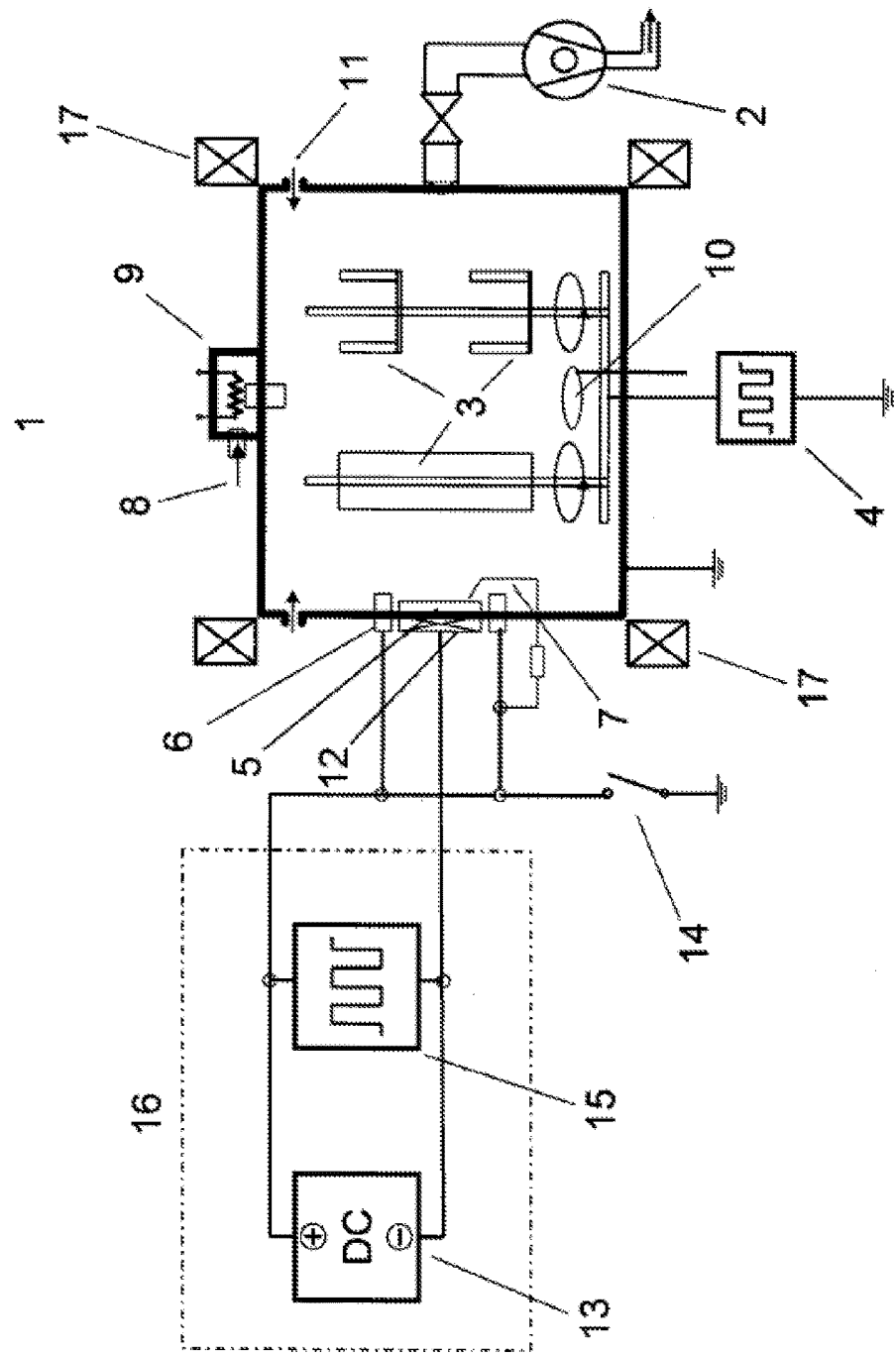
FIG. 1 shows a spark-discharge coating system with a DC and pulsed-current power supply.

The vacuum processing system 1 shown in FIG. 1 comprises equipment for operating an arc source with a combination generator unit 16 containing a DC power supply 13 and, connected in parallel with the latter, a pulsed voltage source 15, in this case a voltage supply 15 for superimposing a pulsed voltage signal on the direct current. This circuitry permits the stable operation of a reactive spark evaporation process even for insulating layers, whereby over a period of time the interior of the system 1, the ignition anode 10 and the substrate mounts 3 or the substrates are coated with an insulating layer. The system 1 is equipped with a pumping station 2 for producing the vacuum, substrate mounts 3 for accepting and electrically contacting work pieces, not illustrated, as well as a bias current supply 4 serving to apply a so-called substrate voltage to the work pieces. The latter may be a DC, an AC or a bipolar or unipolar substrate voltage supply. By way of at least one process gas inlet, inert or reactive gas can be injected for controlling the process pressure and the gas composition in the coating chamber.

The components of the arc source proper include a target 5 with an ignition lug 7 as well as an anode 6 surrounding the target 5. A switch 14 permits selection between a floating operation of the anode on the positive pole of the power supply 13 and operation with a defined zero or ground potential. The arc source may also encompass a target magnet system 12 consisting for instance of one or several field coils and/or a permanent magnet assembly.

Other optional features of the vacuum processing system 1 include an additional plasma source 9, in this case a source for generating a low-voltage arc (LVA) with a hot cathode, an inert gas inlet 8, an auxiliary or ignition anode 10 as well as an additional power supply, not illustrated, for driving the low-voltage arc between the plasma source 9 and the auxiliary anode 10, and, if necessary, field coils 17 for the magnetic focusing of the low-voltage arc plasma.

Figure 2:
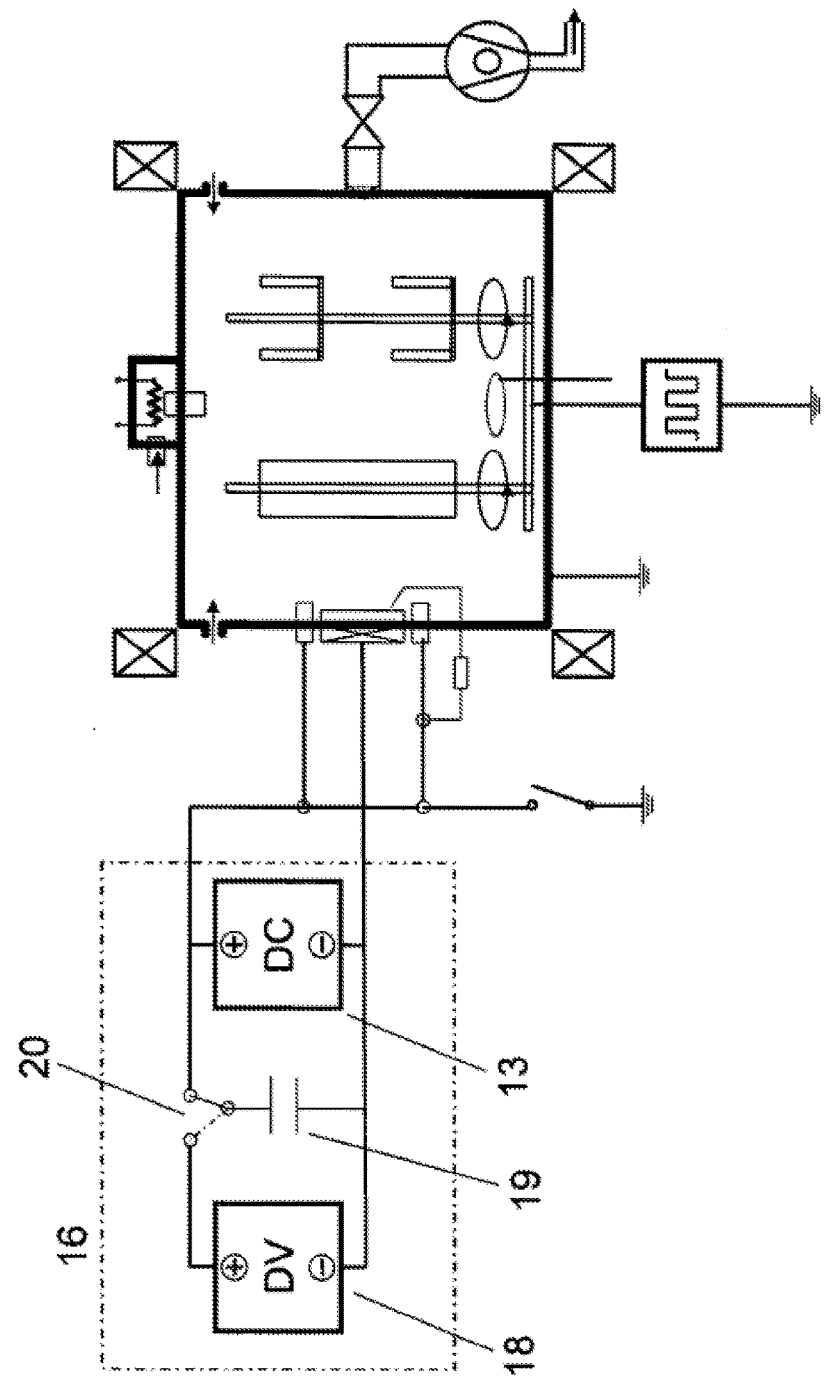
FIG. 2 shows a spark-discharge coating system with a DC power supply and pulsed capacitor.

In FIG. 2, the pulsed voltage source consists of at least one charging-voltage supply 18 serving to charge several capacitors or capacitor arrays 19, with corresponding switches 20 which connect the capacitors 19 to the charging-voltage supply for time-controlled charging or to the arc source for the generation of a spike pulse. For simplicity's sake, FIG. 2 shows only one capacitor 19 and one switch 20, representing an appropriate array of capacitors and switches. The charging-voltage supply 18 furnishes a constant voltage for instance of between 100 and 1000 V, while the operating voltage of a DC power supply 13, here again integrated into a generator unit 16, remains within the usual operating voltage range for spark discharge generators at about 10 to about 100 V.

Figure 3:
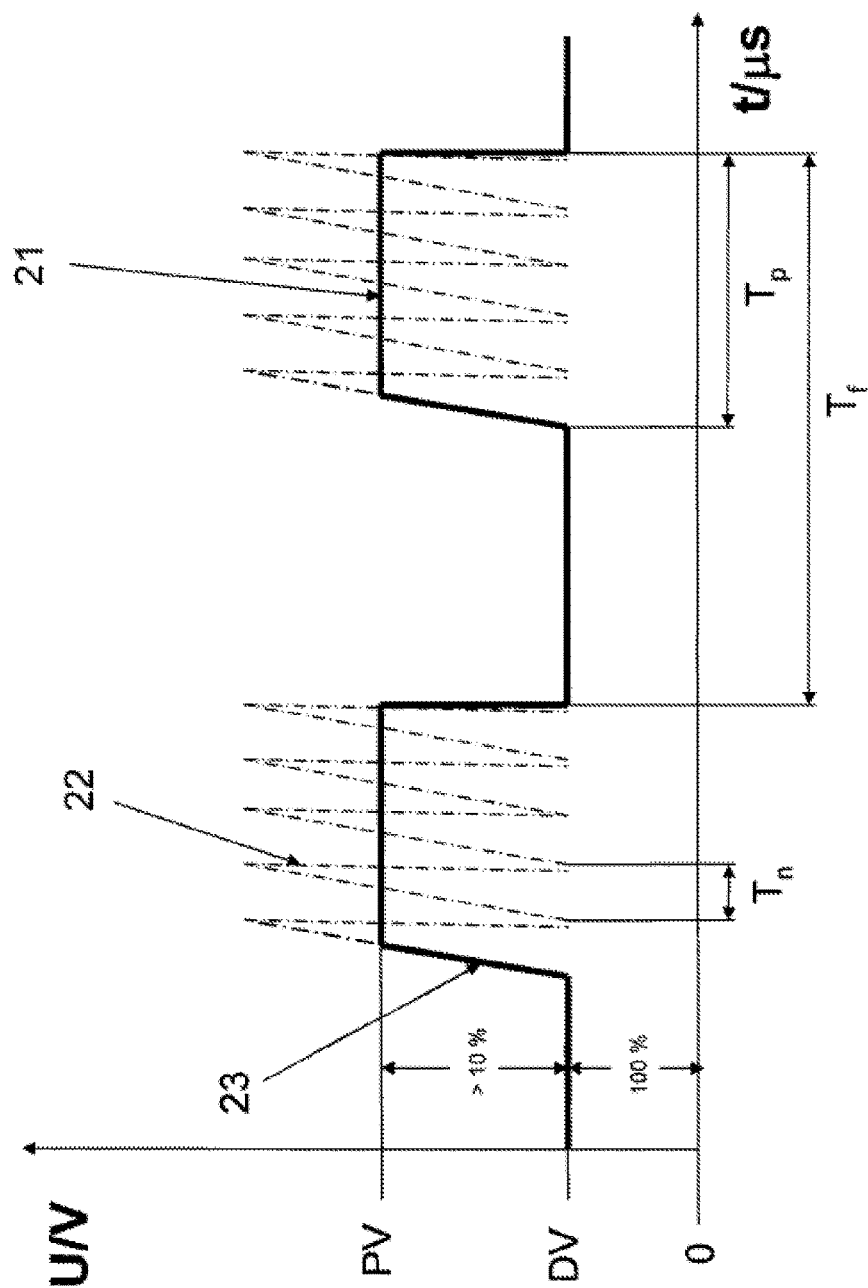
FIG. 3 schematically illustrates a voltage gradient pattern.

FIG. 3 illustrates one possible voltage gradient pattern that can be generated by the appropriate actuation of the switches 20. In this case, a number of capacitor discharges are sequenced in such fashion that the resultant 21 of the spike pulses 22, generated by the discharges of the capacitors, produces the shape of the pulsed voltage signal with a pulse voltage PV. In the case of spike pulses of equal height, the idealized resultant 21, essentially corresponding to the effectively measured voltage, will be at roughly two thirds the height of the maximum spike voltage and may be overlaid by a ripple caused by electric impedances and by the inter-spike spacing. In the example, the spike pulses are shown as triangles without gaps. Of course, the spike pulses may be shaped differently and may be lined up in a gapped formation. The pulsed voltage signals sit on top of the low voltage direct-current signal generated by the DC power supply 13 with a height of DV. The rapid packeted succession of the spike pulses 22 with a duration $T_n$ permits maintaining the voltage increase PV-DV stable over a longer time period $T_p$ but at least long enough to form a pulse signal of the duration $T_f$. The shape of the signal can be varied, as known to those skilled in the art, by applying spike pulses of varying heights or lengths or by adapting the capacitor discharges to the impedance of the spark discharge. In the case of a square wave signal the ascending slope 23 of the resultant 21 may be identical to the slope of the spike pulses, provided the selected capacity of the individual capacitor is sufficiently high. As an alternative known to those skilled in the art, a large number of smaller capacitors can be clocked in synchronous fashion to force the generation of a corresponding voltage signal.

$T_f$ in this case may be set at between 5 μs and 1 sec, but preferably between 20 μs and 100 ms. As mentioned above, gapped operation is possible as well. $T_n$ may be set at between 1 μs and 100 ms, preferably between 2 μs and 1 ms. If the voltage signals are to be extremely short, the voltage signal may even be formed by a single spike pulse. In that case, all there will be is one voltage peak. However, the desirable feature of this present method, i.e. the ability to arbitrarily select the signal shape, cannot be utilized to advantage until there is a minimum succession of three, or better five and most preferably ten spike pulses per voltage signal. Thus, for instance when using a square pulse, the time during which the full pulse voltage can be applied will amount to at least three, five or ten microseconds, preferably not less than six, fifteen or thirty microseconds. The maximum duration in the case of clocked timing may be set at half the frequency of the voltage signal.

Similarly, for bringing about the desired increase in the spark discharge voltage, a power supply such as the one described in WO 06099759 can serve to generate very steep, well-defined voltage signals which may even be composed of a packet of consecutive spike pulses.

Figure 4:
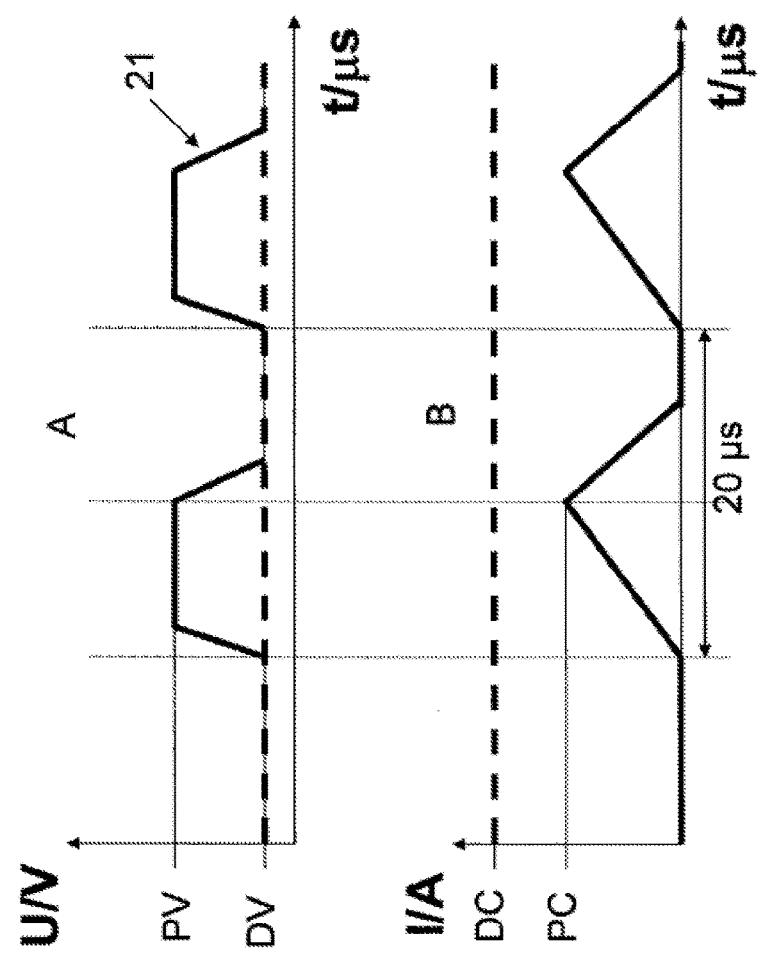
FIG. 4 schematically illustrates a voltage/current gradient pattern.

FIG. 4 shows the basic voltage/current pattern for the way these pulsed, parallel-connected voltage sources function. Analogous to FIG. 3 but without specific details on the generation of the resultant 21, FIG. 4A shows the voltage gradient pattern resulting from the spark voltage generated by the DC power supply 13 (dotted line) and the pulse voltage source 15 or, respectively, 18 to 20 (solid line). FIG. 4B shows the corresponding current gradient pattern. The rise of the spark current practically occurs immediately upon the application of the pulsed signal, having the height PV, by the pulsed voltage source, thus boosting the discharge current flowing through the spark discharge plasma. It should be noted that in FIGS. 4 and 5 it is not the cumulative curve of the discharge current but the separately depicted curves of the currents generated by the pulsed voltage source (solid line) and, respectively, the DC power supply 13 (dotted line). While the spark voltage rapidly reaches its setpoint value which can be held fairly stationary over the length of the pulse, the spark current builds up in nearly linear fashion over the entire pulse duration at a distinctly flatter slope angle due to wiring impedances and other resistances in the spark current circuit. As would be expected based on the Townsend diagram, the spark current will not reach saturation. Not until the voltage pulse is turned off and the spark discharge voltage has dropped off will the spark current abate again. It follows that, in principle, pulsed voltage sources that are connected in parallel with a DC spark current supply permit the attainment of quasi-stationary increases of the spark discharge voltage. The slope and the degree of the voltage increase in pulsed operation will depend on various parameters such as wiring impedances, discharge impedance, target material etc. Moreover, the slope angle of the pulse and the amplitude of the voltage increase have an effect on each other. The steeper the slope of the voltage pulse, the greater the possible voltage excess due to the relative inertia of the current rise. Of course, it will also be evident from FIG. 4 that the pulse length cannot be limitless since the voltage elevation causes the spark current to track which, upon reaching a threshold value, also known as fault current, usually results in the automatic shut-off of the power supply. This automatic shut-off point on its part, added to the limitation over the pulse length $T_p$ of the voltage signal, the time length $T_n$ as well as the sequence and configuration of the spike pulses, can be utilized to control the current increase and the associated evaporation processes on the spark cathode.

Figure 5:
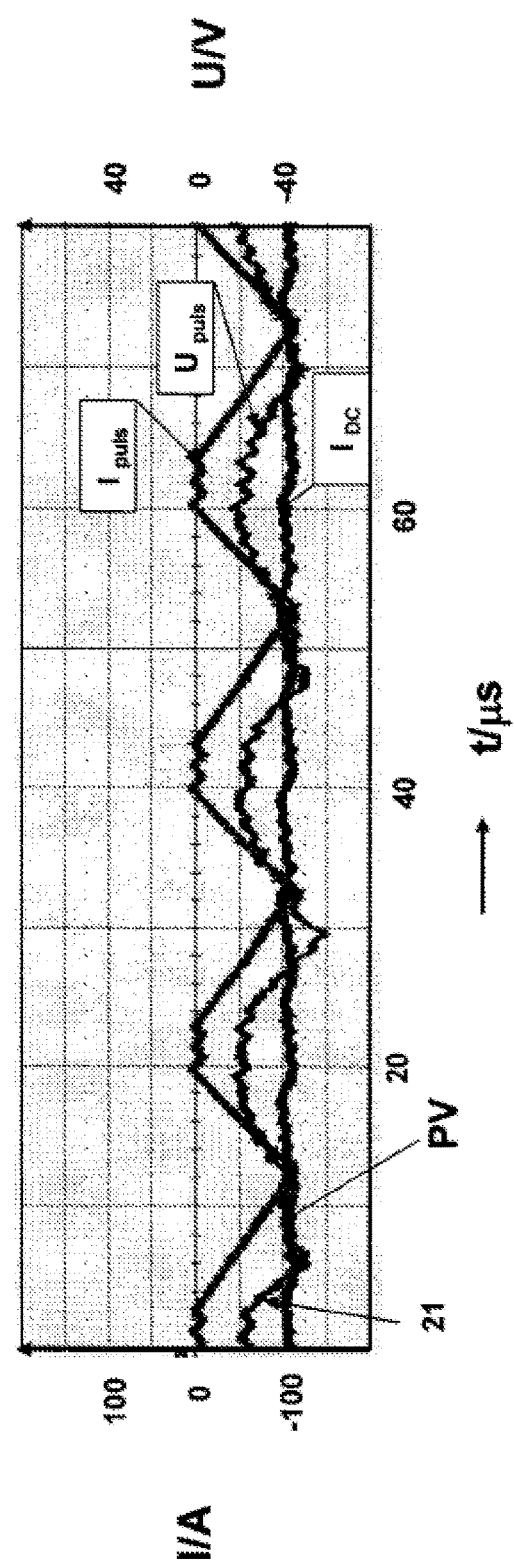
FIG. 5 shows a measured voltage/current gradient pattern.

FIG. 5 shows a voltage-current curve, recorded during a pulsed coating process described in more detail further below, with the voltage signal $U_{puls}$ periodically applied by a pulsed voltage supply 15, and with a corresponding pulsed current $I_{puls}$ superimposed over the direct current $I_{DC}$. Here as well it can be seen that even after reaching the pulsed voltage PV the pulsed current continues to rise until the pulse is turned off. In this case the voltage excess relative to the DC operation is about −20 V.

The voltage-current curves shown were recorded during the deposition of $Al_2O_3$ and $(Al, Cr)_2O_3$ layers in an Oerlikon Balzers Innova production system under the following conditions:

1. Process Parameters Used in Spark Evaporation for Producing Aluminum Oxide:

| | |
|---|---|
| Oxygen flow | 400 sccm |
| Process pressure | $1 \times 10^{-2}$ mbar |
| DC source current Al target | 100 A |
| Pulse source current Al target | 100 A at 50 kHz, 10 µs pulse/10 µs interval |
| Substrate bias | −40 V DC pulsed or AC (in either case 50-350 kHz) |
| Substrate temperature | approx. 500° C. |
| Process duration | 60 to 120 min, individual experiments for 360 min |

The rise time of the ascending slope 23 of the resultant voltage pulse was measured at approx. 6 V/µs.

2. Process Parameters Used in Spark Evaporation for Producing Aluminum/Chromium Oxide Mixed Crystals of a Corundum Structure:

| | |
|---|---|
| Oxygen flow | 1000 sccm |
| Process pressure | $2.6 \times 10^{-2}$ mbar |
| DC source current $Al_{0.7}Cr_{0.3}$: | 120 A |
| Pulse source current $Al_{0.7}Cr_{0.3}$: | 100 A, 30 kHz, 8 µs pulse/25 µs interval. |

The coil current of the source magnetic field, Oerlikon Balzers model MAG 6, was set at 0.5 A.
That generated on the target surface a weak, essentially vertical magnetic field of about 2 mT (20 Gs).

| | |
|---|---|
| Substrate bias | U = −60 V (bipolar, 36 µs negative, 4 µs positive) |
| Substrate temperature | approx. 550° C. |
| Process duration | 60 to 120 min |

The rise time of the ascending slope 23 of the resultant voltage pulse was measured at approx. 2 V/µs.

By suitable adjustments to the pulse voltage supply, for instance by selecting very short cable connections to the spark sources, slopes of up to 100 V/µs were achieved.

LIST OF REFERENCE NUMBERS

1 Spark-discharge coating system
2 Vacuum pump station
3 Substrate mount
4 Pulsed bias supply
5 Target
6 Anode
7 Ignition device
8 Ionization chamber
8 Filament
10 Auxiliary/ignition anode
11 Gas inlet
12 Target magnet system
13 DC power supply
14 Ground switch
15 Pulsed voltage supply
16 Generator unit
17 Field coil
18 Charging voltage supply
19 Capacitor
20 Pulse switch
21 Resultant
22 Spike pulse
23 Ascending slope

The invention claimed is:

1. Method for operating an arc source, whereby an electric spark discharge is ignited and run on a surface of a target (5) to evaporate the target (5) to deposit onto a substrate, and the electric spark discharge is simultaneously fed a direct current with an associated constant voltage DV as well as a periodically applied pulsed current, characterized in that
a pulsed voltage signal (21) is generated by a pulsed voltage source delivering a desired shape of the pulsed voltage signal,
the pulsed current results from the pulsed voltage signal (21) and the pulsed voltage signal (21) is generated with a pulse length ($T_p$) of at least two microseconds, wherein the pulsed voltage signal and pulsed current each have ascending slopes, wherein the pulsed current reaches a pulsed current maximum after the pulsed voltage signal reaches a pulsed voltage maximum, and wherein the pulsed voltage signal remains constant at the used voltage maximum until the used current reaches the pulsed current maximum.

2. Method as in claim 1, characterized in that a shape of the pulsed voltage signal is arbitrarily selectable.

3. Method as in claim 1, characterized in that the frequency of the pulsed voltage signal is selected between 1 Hz and 200 kHz.

4. Method as in claim 2, characterized in that the shape of the pulsed voltage signal is in the form of a sawtooth, a polygon, or a trapezoid.

5. Method as in claim 1, characterized in that the pulsed voltage signal is applied in gapped succession.

6. Method as in claim 1, characterized in that the pulsed voltage signal is turned off when a detected current threshold is exceeded.

7. Method as in claim 2, characterized in that the shape of the pulsed voltage signal is constituted of the resultant (21) of a succession of spike pulses (22).

8. Method as in claim 7, characterized in that the spike pulses (22) are generated by a time-controlled sequence of discharges of individual capacitors (19) or by a pulsed power supply (15).

9. Method as in claim 7, characterized in that an edge steepness of an ascending slope (23) of each of the spike pulses (22) is at least 0.5 V/µs.

10. Method as in claim 7, characterized in that the succession or duration of the spike pulses (22) is between 0.1 kHz and 1 MHz or, respectively, between 10 ms and 1 µs.

11. Method as in claim 7, characterized in that a height of the spike pulses (22) exceeds that of the associated constant voltage DV by at least 10 percent.

12. Method as in claim 7, characterized in that at least 3 spike pulses (22) are used for generating the pulsed voltage signal.

13. Method as in claim 1, characterized in that the pulsed voltage signal is provided by a pulsed voltage supply (15) or generator unit (16) that is arbitrarily adjustable with regard to signal length, signal frequency, voltage amplitude, interpulse periods and/or shape of the signal.

14. Method as in claim 1, characterized in that the pulsed voltage signal is provided by a pulsed voltage supply (15) or generator unit (16) that is arbitrarily adjustable with regard to the timed sequence, slope angle and/or height of the spike pulses (22).

15. Method as in claim 1, characterized in that a steepness of the ascending slope (23) of the pulsed voltage signal is at least 0.5 V/μs.

16. Method as in claim 11, characterized in that the pulsed voltage signal is applied over an entirety of the pulse length $T_p$.

17. Method as in claim 1, characterized in that insulating oxide-containing or oxidic layers are deposited.

18. Method as in claim 1, characterized in that a material of the target (5) consists of carbon or of a material containing more than 20% carbon by volume.

19. Method for operating an arc source comprising:
igniting an electric spark discharge and running the electric spark discharge on a surface of a target to evaporate the target (5) to deposit onto a substrate;
using a voltage source to generate a pulsed voltage signal having a pulse length of at least two microseconds;
feeding the electric spark discharge a periodically applied pulsed current, wherein the pulsed current results from the pulsed voltage signal, and simultaneously feeding the electric spark discharge a direct current having a constant voltage; and wherein the pulsed voltage signal and pulsed current each have ascending slopes, wherein the pulsed current reaches a pulsed current maximum after the pulsed voltage signal reaches a pulsed voltage maximum, and wherein the pulsed voltage signal remains constant at the pulsed voltage maximum until the pulsed current reaches the pulsed current maximum.

\* \* \* \* \*